(12) United States Patent
Bi et al.

(10) Patent No.: US 10,490,546 B2
(45) Date of Patent: Nov. 26, 2019

(54) FORMING ON-CHIP METAL-INSULATOR-SEMICONDUCTOR CAPACITOR

(71) Applicant: INTERNATIONAL BUSINESS MACHINES CORPORATION, Armonk, NY (US)

(72) Inventors: Zhenxing Bi, Niskayuna, NY (US); Kangguo Cheng, Schenectady, NY (US); Peng Xu, Guilderland, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 15/464,441

(22) Filed: Mar. 21, 2017

(65) Prior Publication Data
US 2018/0122796 A1 May 3, 2018

Related U.S. Application Data

(62) Division of application No. 15/339,164, filed on Oct. 31, 2016, now Pat. No. 9,899,372.

(51) Int. Cl.
*H01L 27/06* (2006.01)
*H01L 49/02* (2006.01)
(Continued)

(52) U.S. Cl.
CPC ........ *H01L 27/0629* (2013.01); *H01L 21/308* (2013.01); *H01L 21/3086* (2013.01); *H01L 21/32139* (2013.01); *H01L 21/76224* (2013.01); *H01L 21/823431* (2013.01); *H01L 21/823481* (2013.01); *H01L 28/82* (2013.01); *H01L 28/90* (2013.01); *H01L 29/785* (2013.01)

(58) Field of Classification Search
CPC ......... H01L 27/0629; H01L 21/823431; H01L 27/0251; H01L 29/785
USPC ................................................. 257/303, 308
See application file for complete search history.

(56) References Cited

U.S. PATENT DOCUMENTS

| 4,898,839 A | 2/1990 | Fujinuma et al. |
| 6,271,084 B1 | 8/2001 | Tu et al. |
| (Continued) | | |

OTHER PUBLICATIONS

List of IBM Patents or Patent Applications Treated as Related dated Mar. 21, 2017, 2 pages.
(Continued)

*Primary Examiner* — Robert T Huber
*Assistant Examiner* — Eric W Jones
(74) *Attorney, Agent, or Firm* — Tutunjian & Bitetto, P.C.; Vazken Alexanian

(57) ABSTRACT

A method is presented for forming a semiconductor structure. The method includes forming a plurality of fins on a first region of the semiconductor substrate, forming a bi-polymer structure, selectively removing the first polymer of the bi-polymer structure and forming deep trenches in the semiconductor substrate resulting in pillars in a second region of the semiconductor structure. The method further includes selectively removing the second polymer of the bi-polymer structure, doping the pillars, and depositing a high-k metal gate (HKMG) over the first and second regions to form the MIS capacitor in the second region of the semiconductor substrate.

20 Claims, 12 Drawing Sheets

(51) Int. Cl.
  *H01L 29/78* (2006.01)
  *H01L 21/8234* (2006.01)
  *H01L 21/3213* (2006.01)
  *H01L 21/308* (2006.01)
  *H01L 21/762* (2006.01)

(56) References Cited

U.S. PATENT DOCUMENTS

| | | | |
|---|---|---|---|
| 6,630,380 B1 | 10/2003 | Cheng et al. | |
| 6,861,692 B2 | 3/2005 | Kujirai et al. | |
| 7,276,751 B2 | 10/2007 | Ho et al. | |
| 7,932,564 B2* | 4/2011 | Goto | H01L 21/823412 257/365 |
| 9,275,936 B2 | 3/2016 | Gates et al. | |
| 2003/0013241 A1 | 1/2003 | Rockwell et al. | |
| 2006/0081895 A1* | 4/2006 | Lee | H01L 21/823431 257/288 |
| 2008/0296702 A1* | 12/2008 | Lee | H01L 21/823431 257/401 |
| 2011/0175152 A1* | 7/2011 | Booth, Jr. | H01L 21/845 257/306 |
| 2013/0143392 A1 | 6/2013 | Romano et al. | |
| 2014/0252469 A1* | 9/2014 | Lee | H01L 29/66431 257/337 |
| 2015/0014780 A1* | 1/2015 | Kim | H01L 27/0924 257/369 |
| 2015/0155180 A1 | 6/2015 | Ban et al. | |
| 2015/0311149 A1 | 10/2015 | Munding et al. | |
| 2015/0357439 A1* | 12/2015 | Liu | H01L 29/66795 257/401 |
| 2016/0071930 A1 | 3/2016 | Bentley et al. | |
| 2016/0190133 A1* | 6/2016 | Wu | H01L 27/0922 257/369 |
| 2018/0019241 A1* | 1/2018 | Brunco | H01L 21/02529 |

OTHER PUBLICATIONS

Office Action with cited art in corresponding U.S. Appl. No. 15/668,985 dated Sep. 14, 2018.

* cited by examiner

US 10,490,546 B2

FORMING ON-CHIP METAL-INSULATOR-SEMICONDUCTOR CAPACITOR

BACKGROUND

Technical Field

The present invention relates generally to semiconductor devices, and more specifically, to forming on-chip metal-insulator-semiconductor (MIS) capacitors.

Description of the Related Art

In order to be able to construct integrated circuits (ICs), such as memory, logic, and other devices, of higher integration density than currently feasible, a developer has to find ways to further downscale the dimensions of capacitors, such as metal oxide semiconductor capacitors, and field effect transistors (FETs), such as metal-oxide-semiconductor field effect transistors (MOSFETs). Scaling achieves compactness and improves operating performance in devices by shrinking the overall dimensions and operating voltages of the device while maintaining the device's electrical properties. The dimensions of the device should be scaled simultaneously in order to optimize the electrical performance of the device.

SUMMARY

In accordance with an embodiment, a method is provided for forming a metal-insulator-semiconductor (MIS) capacitor. The method includes forming a plurality of fins on a first region of the semiconductor substrate, forming a bi-polymer structure, selectively removing the first polymer of the bi-polymer structure, forming deep trenches in the semiconductor substrate resulting in pillars in a second region of the semiconductor structure, selectively removing the second polymer of the bi-polymer structure, doping the pillars, and depositing a high-k metal gate (HKMG) over the first and second regions to form the MIS capacitor in the second region of the semiconductor substrate.

In accordance with another embodiment, a semiconductor device for forming a metal-insulator-semiconductor (MIS) capacitor is provided. The semiconductor device includes a plurality of fins formed on a first region of the semiconductor substrate, a bi-polymer structure, where initially the first polymer of the bi-polymer structure is selectively removed, deep trenches formed in the semiconductor substrate resulting in pillars in a second region of the semiconductor structure, where subsequently the second polymer of the bi-polymer structure is selectively removed, and a high-k metal gate (HKMG) deposited over the first and second regions, after doping of the pillars, to form the MIS capacitor in the second region of the semiconductor substrate.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
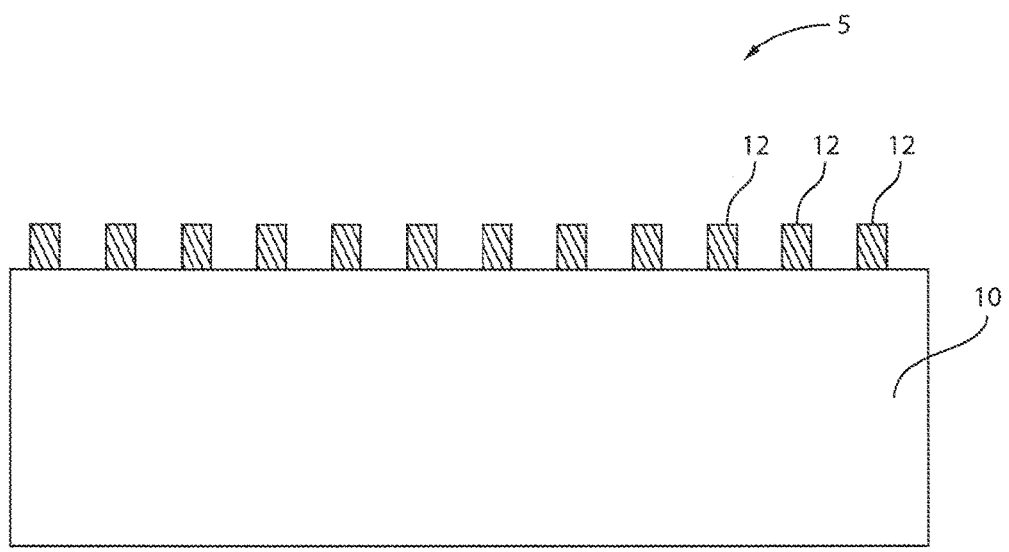
FIG. 1 is a cross-sectional view of a semiconductor structure including a fin hard mask, in accordance with an embodiment of the present invention.

Embodiments of the present invention relate generally to a method for forming a metal-insulator-semiconductor (MIS) capacitor. The method includes forming a plurality of fins on a first region of the semiconductor substrate, forming a bi-polymer structure, selectively removing the first polymer of the bi-polymer structure, forming deep trenches in the semiconductor substrate resulting in pillars in a second region of the semiconductor structure, selectively removing the second polymer of the bi-polymer structure, doping the pillars, and depositing high-k metal gate (HKMG) over at least the pillars to form the MIS capacitor in the second region of the semiconductor substrate.

Moreover, embodiments of the present invention relate generally to a semiconductor device for forming a metal-insulator-semiconductor (MIS) capacitor. The semiconductor device includes a plurality of fins formed on a first region of the semiconductor substrate, a bi-polymer structure, where initially the first polymer of the bi-polymer structure is selectively removed, deep trenches formed in the semiconductor substrate resulting in pillars in a second region of the semiconductor structure, where subsequently the second polymer of the bi-polymer structure is selectively removed, and a high-k metal gate (HKMG) deposited over at least the pillars, after doping of the pillars, to form the MIS capacitor in the second region of the semiconductor substrate.

In one or more embodiments, the overlay process window for Deep STI (shallow trench isolation) patterning is increased by building an on-chip MIM (metal-insulator-metal) capacitor with a DSA (directed self-assembly) process and shared high-k metal gate with the device region. The exemplary embodiments of the present invention provide for a method and structure for forming a MIS capacitor with a VFET (vertical field effect transistor) process and using a high-k metal gate (HKMG).

In one or more embodiments, the present invention provides for forming a MIS capacitor with a VFET process in non-fin region in FEOL (first end of line) by using a DSA method and also by forming deep STI trenches. The present invention further describes forming on-chip MIS capacitors with a VFET fabrication process such that the VFET structure is separate and distinct from the MIS capacitor.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, the terms "insulating" and "dielectric" denote a material having a room temperature conductivity of less than about $10^{-10}$ $(\Omega\text{-m})^{-1}$.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE). Reactive ion etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation.

The term "processing" as used herein includes deposition of material or photoresist, patterning, exposure, development, etching, cleaning, stripping, implanting, doping, stressing, layering, and/or removal of the material or photoresist as required in forming a described structure.

The terms "gas" and "gases" are used interchangeably, unless otherwise noted, and refer to one or more precursors, reactants, catalysts, carrier, purge, cleaning, combinations thereof, as well as any other fluid introduced into the chamber body.

As used herein, a surface is "substantially planar" if the surface is intended to be planar and the non-planarity of the surface is limited by imperfections inherent in the processing steps that are employed to form the surface.

Exemplary types of semiconductor devices include planar field effect transistors (FETs), fin-type field effect transistors (FinFETs), nanowire/nanosheet devices, vertical field effect transistors (VFETs), or other devices.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

As used herein, the term "fin structure" refers to a semiconductor material, which can be employed as the body of a semiconductor device, in which a gate structure is positioned around the fin structure such that charge flows down the channel on the two sidewalls of the fin structure and optionally along the top surface of the fin structure. The fin structures are processed to provide FinFETs. A field effect transistor (FET) is a semiconductor device in which output current, i.e., source-drain current, is controlled by the voltage applied to the gate structure to the channel of a semiconductor device. A finFET is a semiconductor device that positions the channel region of the semiconductor device in a fin structure.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

It is to be understood that the present invention will be described in terms of a given illustrative architecture; however, other architectures, structures, substrate materials and process features and steps/blocks can be varied within the scope of the present invention. It should be noted that certain features may not be shown in all figures for the sake of clarity. This is not intended to be interpreted as a limitation of any particular embodiment, or illustration, or scope of the claims.

FIG. 1 is a cross-sectional view of a semiconductor structure including a fin hard mask, in accordance with an embodiment of the present invention.

Figure 3:
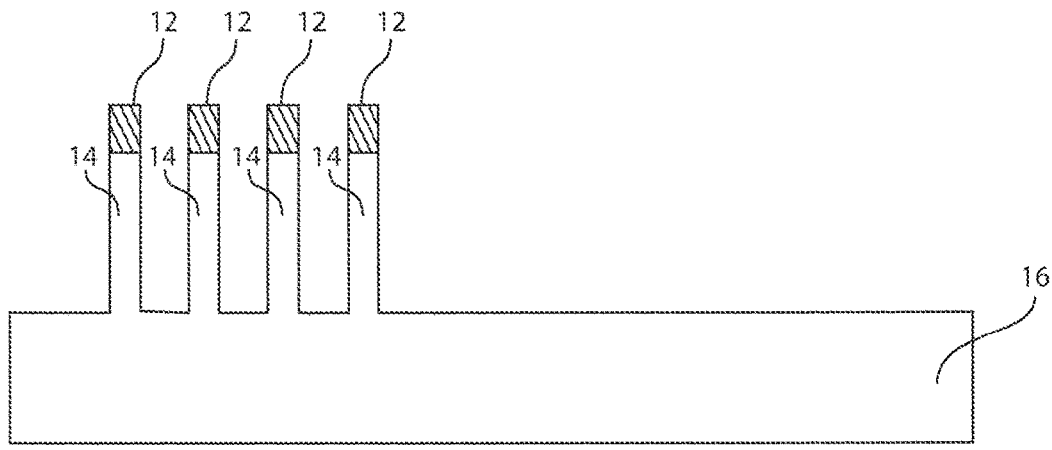
FIG. 3 is a cross-sectional view of the semiconductor device of FIG. 2 where a plurality of fins are formed, in accordance with an embodiment of the present invention.

A semiconductor structure 5 includes a semiconductor substrate 10. A fin hard mask is placed over the substrate 10 to form a cap portion 12 of a plurality of fins 14 (FIG. 3). The hard mask can be, e.g., a SiN (silicon nitride) hard mask. Of course, the mask can be any type of block mask contemplated by one skilled in the art.

In one or more embodiments, the block mask can comprise soft and/or hard mask materials and can be formed using deposition, photolithography and etching. In one embodiment, the block mask comprises a photoresist. A photoresist block mask can be produced by applying a photoresist layer, exposing the photoresist layer to a pattern of radiation, and then developing the pattern into the photoresist layer utilizing conventional resist developer. Typically, the block masks have a thickness ranging from 100 nm to 300 nm.

The block mask can comprise soft and/or hard mask materials and can be formed using deposition, photolithography and etching. In one embodiment, the block mask is a hard mask composed of a nitride-containing material, such as silicon nitride (SiN). It is noted that it is not intended that the block mask be limited to only SiN, as the composition of the hard mask can include any dielectric material that can be deposited by chemical vapor deposition (CVD) and related methods. Other hard mask compositions for the block mask can include silicon oxides, silicon oxynitrides, silicon carbides, silicon carbonitrides, etc. Spin-on dielectrics can also be utilized as a hard mask material including, but not limited to: silsequioxanes, siloxanes, and boron phosphate silicate glass (BPSG).

In one embodiment, a block mask comprising a hard mask material can be formed by blanket depositing a layer of hard mask material, providing a patterned photoresist atop the layer of hard mask material, and then etching the layer of hard mask material to provide a block mask protecting at least one portion of a dummy gate (not shown). A patterned photoresist can be produced by applying a blanket photoresist layer to the surface of the dummy gate, exposing the photoresist layer to a pattern of radiation, and then developing the pattern into the photoresist layer utilizing resist developer. Etching of the exposed portion of the block mask can include an etch chemistry for removing the exposed portion of the hard mask material and having a high selectivity to at least the block mask. In one embodiment, the etch process can be an anisotropic etch process, such as reactive ion etch (RIE). In another embodiment, the replacement gate can be formed by utilizing the SIT patterning and etching process described above.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

Figure 2:
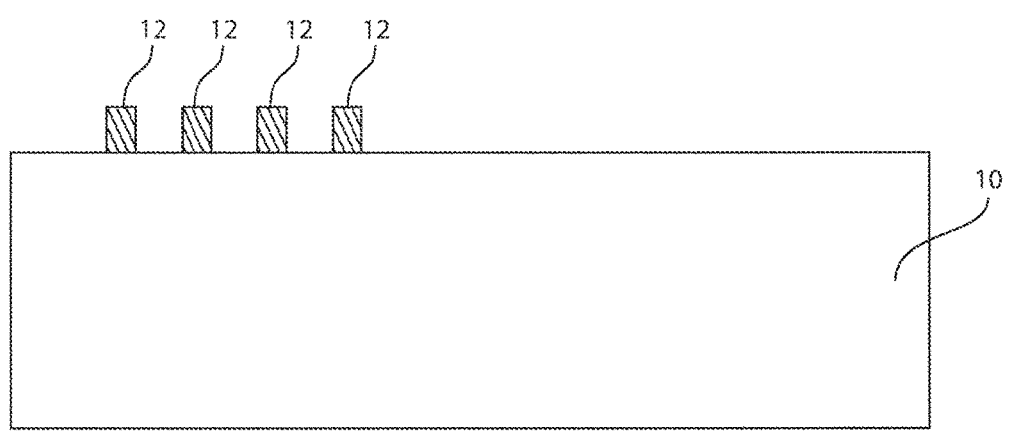
FIG. 2 is a cross-sectional view of the semiconductor structure of FIG. 1 where a fin cut takes place in the hard mask, in accordance with an embodiment of the present invention.

FIG. 2 is a cross-sectional view of the semiconductor structure of FIG. 1 where a fin cut takes place in the hard mask, in accordance with an embodiment of the present invention.

In various embodiments, the plurality of fin cap portions 12 are cut.

Aspects of the present invention relate to methods of semiconductor manufacturing, and more particular aspects relate to methods of thinning and cutting fins from among arrays of fins on a substrate in order to prepare them for inclusion in FinFETs in an integrated circuit. The process of forming FinFETs can be performed by producing large numbers of fins for inclusion in FinFETs. Forming large numbers of fins at once can simplify the manufacturing process and can result in FinFETs with more uniform fins. While the present invention is not necessarily limited to such applications, various aspects of the invention can be appreciated through a discussion of various examples using this context.

During semiconductor manufacturing, fin field effect transistors (FinFETs) can be formed out of a large fin array on a semiconductor substrate. A fin array can include many parallel fins from a layer of fin material in a single step before subsequent processing divides (cuts) the fins into groups or sections. Rather than cutting target fins and target fin segments (hereinafter, target fins) by etching them away, one can cut fins by oxidizing the fin material of the target fins and converting the target fins into nonconductive dielectric fins. Cutting target fins can eliminate a conductive top part of the target fin (some of the fin, or all of the fin) so that no semiconducting part of the target fin can connect with the FinFET gate when the FinFET is complete.

Fins in a fin array can have one or more fin lengths and fin widths, and a variety of fin pitches, as well. Across a single semiconductor wafer, fins with various lengths, widths, and pitches can be processed (cut) simultaneously during a fin cut process, or can be cut in sequential steps according to embodiments of integrated circuit manufacturing flows. Groups and sections of fins left behind after cutting can be incorporated into FinFETs according to integrated circuit designs. The process of cutting fins can be performed to remove long segments of some fins, or to transect shorter segments across a number of other adjacent fins, in order to achieve the desired final fin layout for the integrated circuit. According to embodiments, fin arrays with a fin pitch of 40 nm or less between fins can undergo fin cutting by oxidizing semiconductor fins to create FinFETs. Some embodiments can have a fin pitch of approximately 20 nm between fins that are cut from a fin array. Embodiments with narrow fins can have fin pitches as small as 10 nm, according to aspects of the present invention.

Creating fins in a fin array can include steps of depositing a hard mask made of an oxide such as silicon dioxide or a nitride such as silicon nitride on a layer of fin material, creating a fin pattern in the hard mask, and etching the layer of fin material in order to expose the substrate beneath the fins. Fin materials can include silicon, doped silicon, silicon germanium alloys, and doped silicon germanium alloys, as well as other materials that can be formed into field effect transistors.

Embodiments of the present invention can include methods that leave the hard mask on top of the semiconductor fins in the fin array after the fins are etched and before a conformal liner is deposited on top of the semiconductor fins. Some embodiments can include methods that remove the hard mask before the conformal liner is deposited onto the semiconductor fins. The hard mask is generally a sacrificial material in the film stack, removed before gate material is deposited onto the semiconductor fins. Embodiments of the present invention can describe processing the wafer with and without the hard mask present. Such discussions should not be construed as limiting the scope of the present invention.

The semiconductor fins in the fin array can be cut in order to eliminate some fins (or parts of some fins) to leave a pattern of active fins behind. Active fins generally protrude above the top of a fill material deposited into troughs between fins in the fin array. Cutting target fins in a fin array, such that no part of a target fin protrudes above the top of the fill material in the troughs, can include oxidizing target fins in situ rather than physically removing target fin material by etching down to or into the substrate.

Oxidizing target fins can include oxidizing a top portion of a target fin, or can include oxidizing all of a target fin, according to embodiments. By converting the material of target fins into a nonconductive dielectric material, any semiconducting portion of a target fin can be encapsulated by the fill material deposited between fins and by the dielectric material (dielectric fin) that can remain on top of any semiconducting portion of a target fin. Further, by converting target semiconductor fins into dielectric fins or dielectric material, it is possible to reduce the height of the oxidized target fins through a chemical etching process rather than a plasma etching process if so desired. Cutting semiconductor fins by plasma etching can modify the slope of fin sides adjacent to the target fins, influencing their electrical properties. In some embodiments, wet chemical etching can be more uniform and more selective between materials than plasma etching, preserving fin material and fin profile during the cutting process.

FIG. 3 is a cross-sectional view of the semiconductor device of FIG. 2 where a plurality of fins are formed, in accordance with an embodiment of the present invention.

The plurality of fins 14 are formed by etching portions of the original substrate 10. The plurality of fins 14 are formed on the remaining substrate 16.

As used herein, a "semiconductor fin" refers to a semiconductor structure including a portion having a shape of a rectangular parallelepiped. The direction along which a semiconductor fin 14 laterally extends the most is herein referred to as a "lengthwise direction" of the semiconductor fin 14. The height of each semiconductor fin 14 can be in a range from 5 nm to 300 nm, although lesser and greater heights can also be employed. The width of each semiconductor fin 14 can be in a range from 5 nm to 100 nm, although lesser and greater widths can also be employed. In various embodiments, the fins 14 can have a width in the range of about 6 nm to about 20 nm, or can have a width in the range of about 8 nm to about 15 nm, or in the range of about 10 nm to about 12 nm. In various embodiments, the fins 14 can have a height in the range of about 25 nm to about 75 nm, or in the range of about 40 nm to about 50 nm.

Multiple semiconductor fins 14 can be arranged such that the multiple semiconductor fins 14 have the same lengthwise direction, and are laterally spaced from each other along a horizontal direction that is perpendicular to the lengthwise direction. In this case, the horizontal direction that is perpendicular to the common lengthwise direction is referred to as a "widthwise direction." Each semiconductor fin 14 includes a pair of parallel sidewalls along the lengthwise direction.

In one embodiment, each semiconductor fin 14 can be formed by lithography and etching. The lithographic step can include forming a photoresist (not shown) atop a substrate including a topmost semiconductor material, exposing the photoresist to a desired pattern of radiation and then developing the exposed photoresist utilizing a conventional resist developer. The pattern within the photoresist is then transferred into the topmost semiconductor material. The etch can include a dry etch process, a chemical wet etch process, or any combination thereof. When a dry etch is used, the dry etch can be a reactive ion etch process, a plasma etch process, ion beam etching or laser ablation. The patterned photoresist material can be removed after transferring the pattern utilizing a conventional stripping process.

In another embodiment of the present application, each semiconductor fin 14 can be formed utilizing a SIT (sidewall image transfer) process. In a typical SIT process, spacers are formed on sidewall surface of a sacrificial mandrel that is formed on a topmost semiconductor material of a substrate. The sacrificial mandrel is removed and the remaining spacers are used as a hard mask to etch the topmost semiconductor material of the substrate. The spacers are then removed after each semiconductor fin 14 has been formed. In another embodiment, sequential SIT processes can be utilized to form fins with highly scaled fin width and pitches.

In some embodiments, the fins in the plurality of semiconductor fins 14 can have a fin width between 5 nm and 10 nm. The combination of the fin width and the width of the trough equals, in embodiments, the fin pitch. The fin width and the fin pitch can vary in different areas of a fin array, and can vary from one fin array to another on a semiconductor wafer, according to the design parameters of the integrated circuit that is being made. For example, fins of negatively doped FinFETs can have a different fin size than positively doped FinFETs because of the electrical properties of the materials they are made of.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

Figure 4:
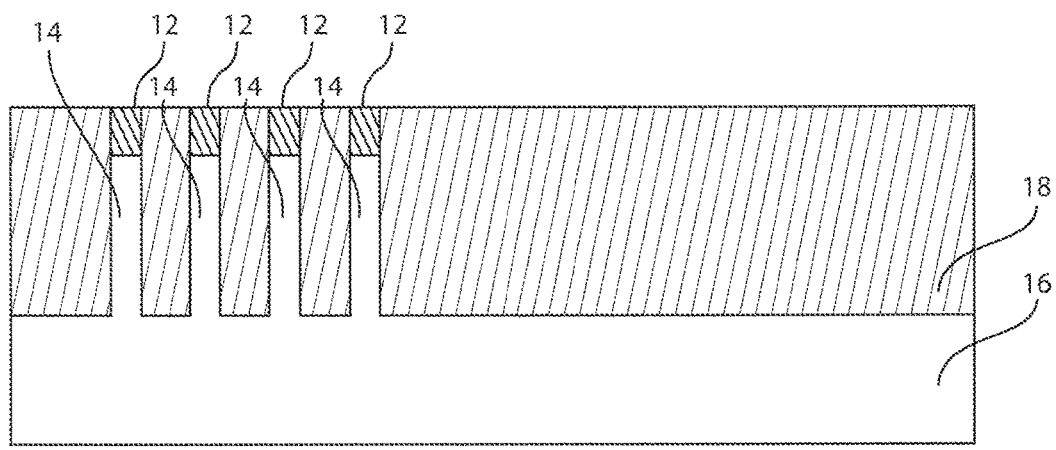
FIG. 4 is a cross-sectional view of the semiconductor device of FIG. 3 where directed self-assembly (DSA) co-polymer deposition is performed, in accordance with an embodiment of the present invention.

FIG. 4 is a cross-sectional view of the semiconductor device of FIG. 3 where directed self-assembly (DSA) copolymer deposition is performed, in accordance with an embodiment of the present invention.

In various embodiments, a DSA co-polymer 18 is deposited over the substrate 16 and on the troughs formed between the plurality of fins 14.

In various embodiments, the height of the DSA copolymer 18 can be selectively reduced by chemical-mechanical polishing (CMP) and/or etching. Therefore, the planarization process can be provided by CMP. Other planarization process can include grinding and polishing.

Directed self-assembly (DSA) uses the self-assembling capability of block copolymers (BCPs) to obtain periodic nano-features on a surface patterned with chemical functionalities or topographies, such as chemical epitaxy or graphoepitaxy, respectively. The BCP self-assembles to form micro-phase separated structures, where the relative length of the polymer chain for either block determines the morphology the material will adopt. With the desired morphology and orientation, the patterns formed by the BCPs can be transferred onto a substrate (e.g., a layer associated with the production of a semiconductor device) through several steps associated with BCP lithography. Structures can be formed using the BCP, such as cylinders or lamellae, which can then be transferred through reactive ion etching to a substrate. For graphoepitaxy, a neutral surface in combination with topographical features controls the location and orientation of the BCP microdomains. For chemical epitaxy, a neutral surface in combination with chemical pinning regions controls the location and orientation of the BCP microdomains. After application of the BCPs to the topographically or chemically patterned surfaces, thermal or solvent annealing methods separate the BCPs into the microdomains.

DSA is based on current state-of-the-art 193 nm immersion lithography with a few additional processing steps that are compatible with current manufacturing flows. Every DSA-associated processing step can be implemented within one to several minutes allowing for throughput to be analogous to current 193 nm lithography flow. However, although individual process steps have been shown using DSA-implemented technologies, it has not been shown how DSA structures can be designed to print a layout of complementary metal-oxide semiconductor (CMOS) standard transistor cells, or how exactly a layout should be designed to enable DSA.

Figure 5:
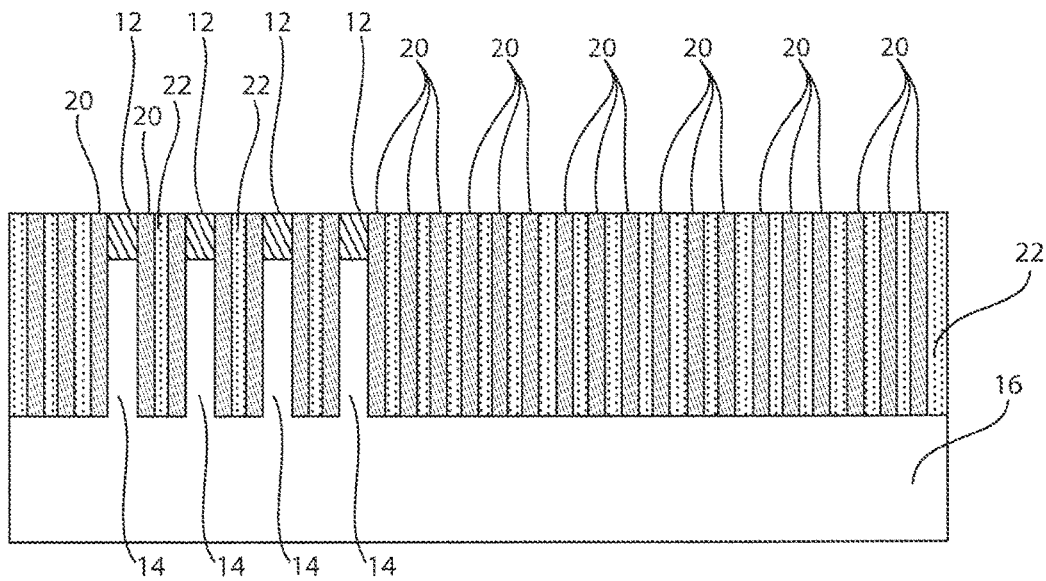
FIG. 5 is a cross-sectional view of the semiconductor device of FIG. 4 where a bi-polymer structure is formed by anneal, in accordance with an embodiment of the present invention.

FIG. 5 is a cross-sectional view of the semiconductor device of FIG. 4 where a bi-polymer structure is formed by anneal, in accordance with an embodiment of the present invention.

In various embodiments, after anneal, a bi-polymer structure is formed. The first polymer 20 and the second polymer 22 of the bi-polymer structure are formed in an alternating manner across the length of the structure. Stated differently, the first and second polymers 20, 22 are arranged in an alternating manner or fashion.

In various embodiments, the height of the first and second polymers 20, 22 can be selectively reduced by chemical-mechanical polishing (CMP) and/or etching. Therefore, the planarization process can be provided by CMP. Other planarization process can include grinding and polishing. The height of the first and second polymers 20, 22 is substantially equal to the height of the plurality of fins 14. The width of the first polymer 20 can be approximately equal to the width of the second polymer 22. Of course, one skilled in the art can contemplate polymers 20, 22 having different widths.

Figure 6:
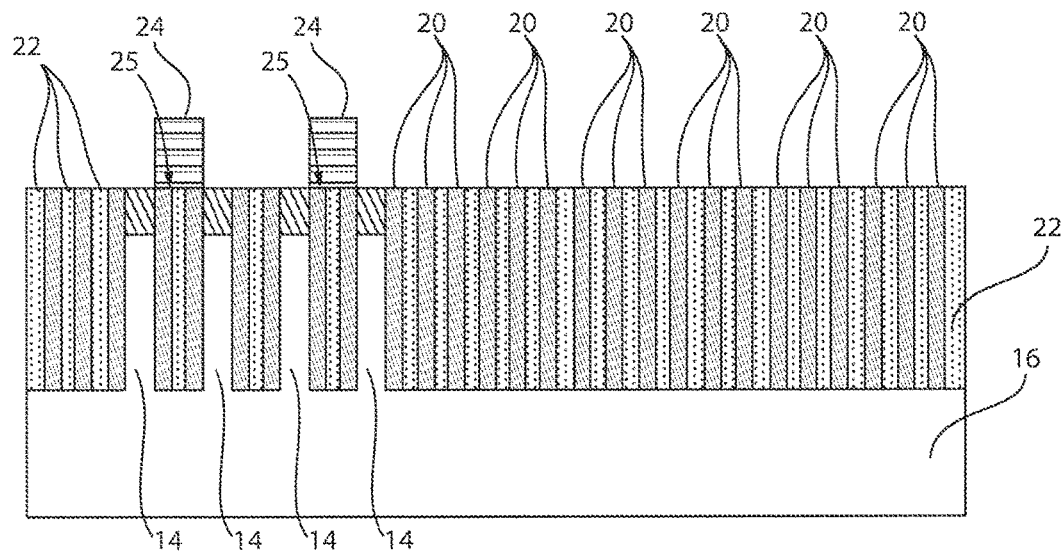
FIG. 6 is a cross-sectional view of the semiconductor device of FIG. 5 where a deep (shallow trench isolation) STI mask is deposited, in accordance with an embodiment of the present invention.

FIG. 6 is a cross-sectional view of the semiconductor device of FIG. 5 where a deep (shallow trench isolation) STI mask is deposited, in accordance with an embodiment of the present invention.

In various embodiments, a deep STI mask 24 is deposited. The bottom surface 25 of the STI mask 24 can contact at least a portion of at least one fin 14. Alternatively, the bottom surface 25 of the STI mask 24 can contact a top surface of the first and second polymers 20, 22.

Shallow Trench Isolation (STI) is used to electrically isolate semiconductor devices that make up an integrated circuit (IC). STI minimizes unwanted current leakage between the semiconductor devices, which can affect the performance of each semiconductor device. Generally, STI structures are formed by etching trenches into a silicon substrate. These trenches are then filled with an insulating dielectric STI fill such as, silicon dioxide ($SiO_2$). The STI structures are formed early in the semiconductor-integrated circuit fabrication process flow. Therefore, the STI fill is exposed to many additional fabrication processes. These additional fabrication processes include many exposures to hydrofluoric acid (HF). The HF is used to etch away unwanted material, such as silicon dioxide, from exposed surfaces.

Figure 7:
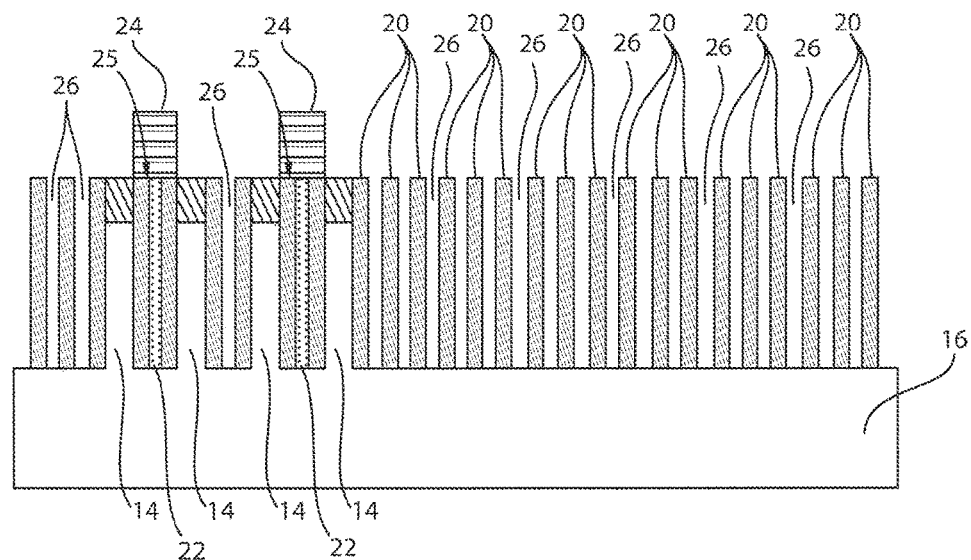
FIG. 7 is a cross-sectional view of the semiconductor device of FIG. 6 where a first polymer of the bi-polymer structure is selectively removed, in accordance with an embodiment of the present invention.

FIG. 7 is a cross-sectional view of the semiconductor device of FIG. 6 where a first polymer of the bi-polymer structure is selectively removed, in accordance with an embodiment of the present invention.

The second polymer 22 is selectively removed. The deep STI mask 24 protects the second polymer 22 formed underneath it. Therefore, the second polymer 22 remains intact in an area between fins 14 that are protected by the STI mask 24. Removal of the second polymer 22 aids in defining the first polymers 20 as pillars that are substantially parallel to each other.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

Figure 8:
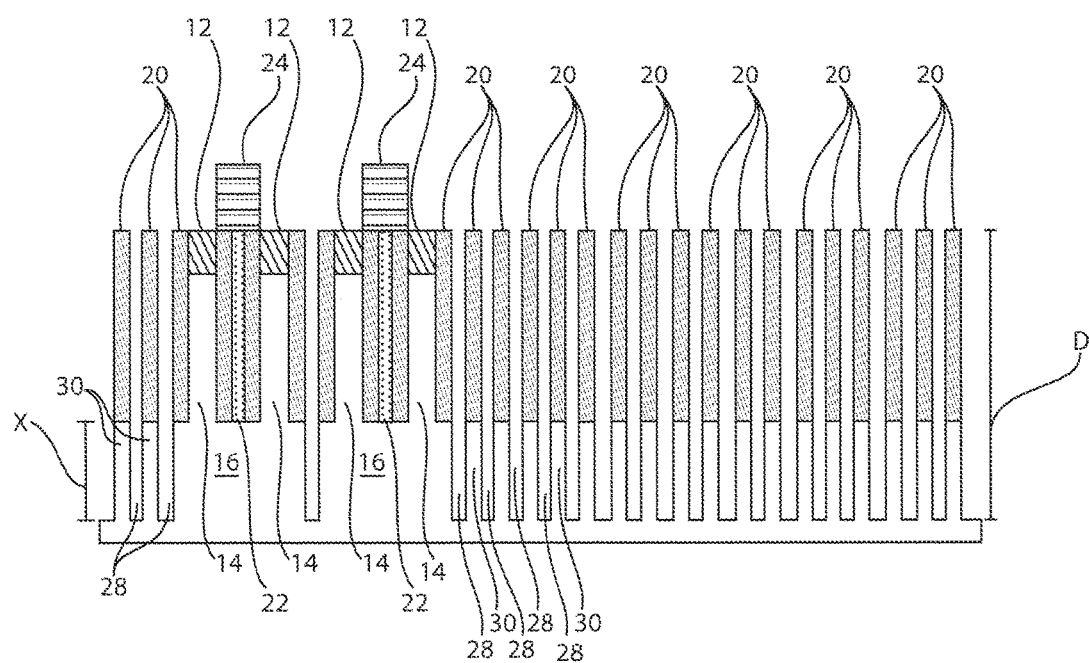
FIG. 8 is a cross-sectional view of the semiconductor device of FIG. 7 where deep trenches are formed, in accordance with an embodiment of the present invention.

FIG. 8 is a cross-sectional view of the semiconductor device of FIG. 7 where deep trenches are formed, in accordance with an embodiment of the present invention.

In various embodiments, a further deep STI takes place such that trenches 28 between the first polymers 20 are extended by a distance or depth "X." The trenches 28 extend below a distal end of the fins 14. Pillars 30 are then defined between the trenches 28. The pillars 30 can have a height less than the height of the pillars defining the first polymer 20. The pillars 30 can have a width approximately equal to the width of the pillars defining the first polymers 20.

Figure 9:
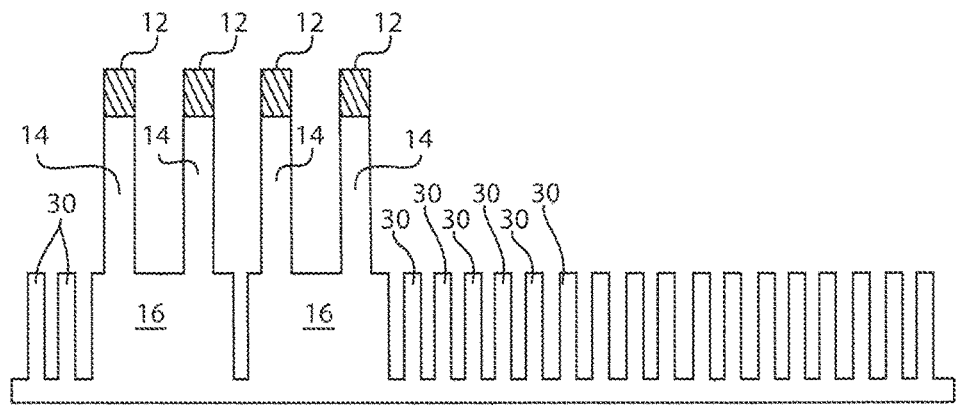
FIG. 9 is a cross-sectional view of the semiconductor device of FIG. 8 where a second polymer of the bi-polymer structure is selectively removed to form pillars in a non-fin region, in accordance with another embodiment of the present invention.

FIG. 9 is a cross-sectional view of the semiconductor device of FIG. 8 where a second polymer of the bi-polymer structure is selectively removed to form pillars in a non-fin region, in accordance with another embodiment of the present invention.

In various embodiments, the first polymer 20 is selectively removed. Also, the STI mask 24 is removed. Removal of the STI mask 24 further results in removal of the first and second polymers 20, 22 formed in areas or regions between the fins 14. Consequently, after removal of the first and second polymers 20, 22, what remains are the pillars 30 separated by troughs, as well as the fins 14 formed over the remaining substrate 16. Therefore, the structure is being primed for separation of the pillars 30 from the plurality of vertical fins 14. As such, two different regions can be distinguished.

Figure 10:
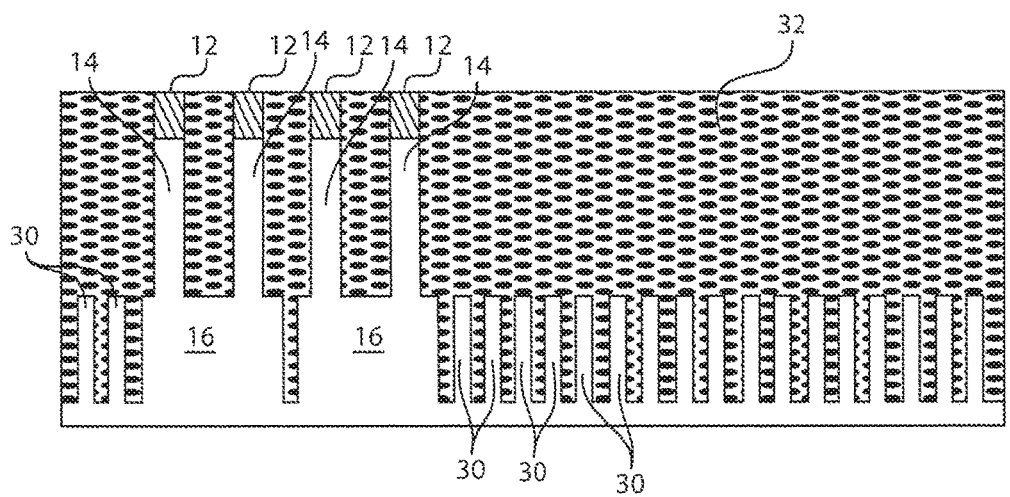
FIG. 10 is a cross-sectional view of the semiconductor device of FIG. 9 where the deep trenches are filled with an oxide, in accordance with an embodiment of the present invention.

FIG. 10 is a cross-sectional view of the semiconductor device of FIG. 9 where the deep trenches are filled with an oxide, in accordance with an embodiment of the present invention.

In various embodiments, an inter-layer dielectric (ILD) oxide fill takes place. The ILD 32 is planarized. The ILD 32 encompasses or envelopes or surrounds the fin structures 14 such that the top surface of the fin cap 12 is exposed. The ILD 32 engages an outer surface of the sidewalls of the plurality of fins 14. In one example embodiment, the ILD 32 is flush with the distal end of the plurality of fins 14. The ILD 32 also covers or encompasses or engulfs the entire surface of the pillars 30 and the troughs formed therebetween.

In one or more embodiments, the ILD 32 can have a thickness in the range of about 20 nm to about 150 nm, or in the range of about 30 nm to about 50 nm.

The ILD 32 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD 32 include any of the aforementioned materials in porous form, or in a form that changes during processing to or from being porous and/or permeable to being non-porous and/or non-permeable.

In various embodiments, the height of the ILD 32 can be selectively reduced by chemical-mechanical polishing (CMP) and/or etching. Therefore, the planarization process can be provided by CMP. Other planarization process can include grinding and polishing.

Figure 11:
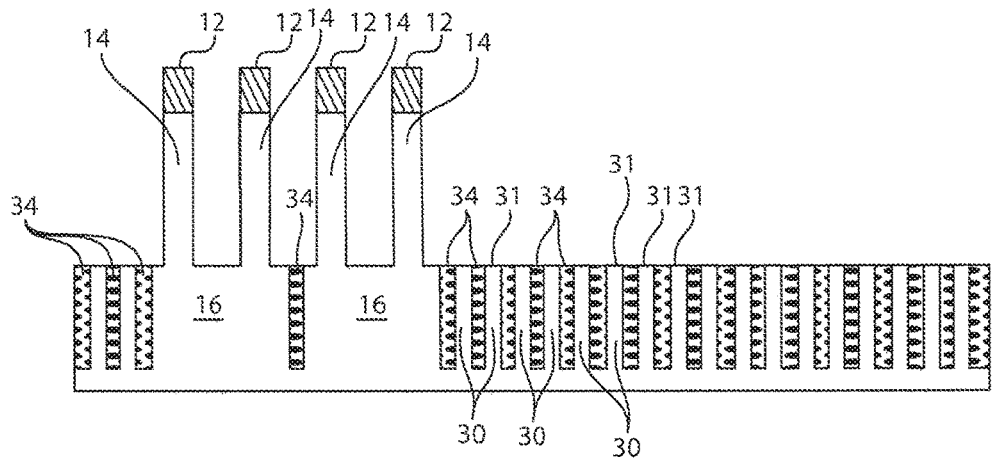
FIG. 11 is a cross-sectional view of the semiconductor device of FIG. 10 where the oxide is recessed such that a top surface of the pillars is exposed, in accordance with an embodiment of the present invention.

FIG. 11 is a cross-sectional view of the semiconductor device of FIG. 10 where the oxide is recessed such that a top surface of the pillars is exposed, in accordance with an embodiment of the present invention.

In various embodiments, the STI fill or ILD 32 is recessed by etching.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process.

The etching results in exposing fins 14 without any oxide thereon or therebetween. However, etching does not remove the oxide 34 between the pillars 30. The top surface 31 of the pillars 30 is thus exposed. Additionally, the top surface of the oxide 34 is exposed.

In various embodiments, the height of the oxide 34 can be selectively reduced by chemical-mechanical polishing (CMP) and/or etching. Therefore, the planarization process can be provided by CMP. Other planarization process can include grinding and polishing. The height of the oxide 34 can be approximately equal to the height of the pillars 30. The width of the pillars 30 can also be approximately equal to the width of the oxide 34.

Figure 12:
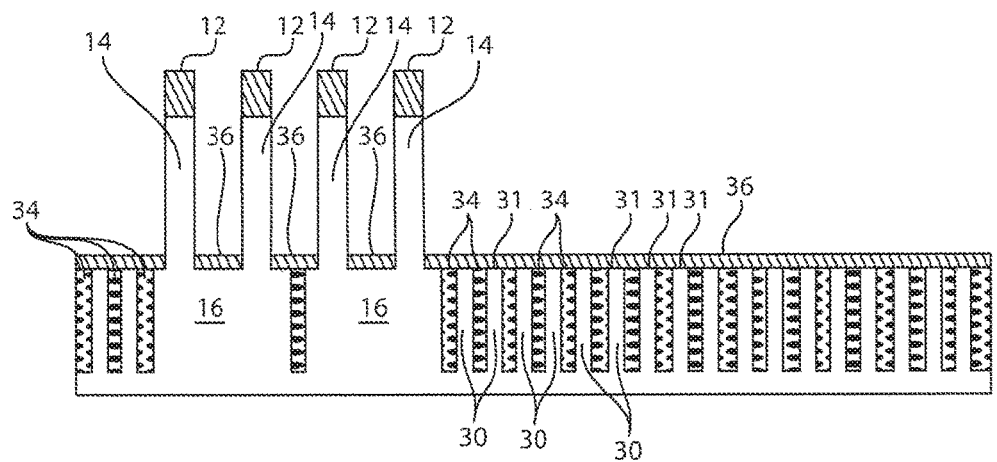
FIG. 12 is a cross-sectional view of the semiconductor device of FIG. 11 where a bottom spacer is deposited, in accordance with an embodiment of the present invention.

FIG. 12 is a cross-sectional view of the semiconductor device of FIG. 11 where a bottom spacer is deposited, in accordance with an embodiment of the present invention.

In various embodiments, a bottom spacer fill takes place. In other words, a first spacer or bottom spacer 36 is deposited, planarized, and etched back so that the bottom spacer 36 is deposited over the pillars 30, over the oxide 34, and over the troughs formed between the plurality of fins 14. The bottom spacer 36 can be, e.g., a nitride film.

In an embodiment, the bottom spacer 36 can be an oxide, for example, silicon oxide (SiO), a nitride, for example, a silicon nitride (SiN), or an oxynitride, for example, silicon oxynitride (SiON).

The planarization process can be provided by chemical mechanical planarization (CMP). Other planarization process can include grinding and polishing.

In one or more embodiments, the bottom spacer 36 can have a thickness in the range of about 3 nm to about 10 nm, or in the range of about 3 nm to about 5 nm. The thickness of the bottom spacer 36 can define a distance between the surface of the substrate 12 to the start of a metal gate, described below.

Figure 13:
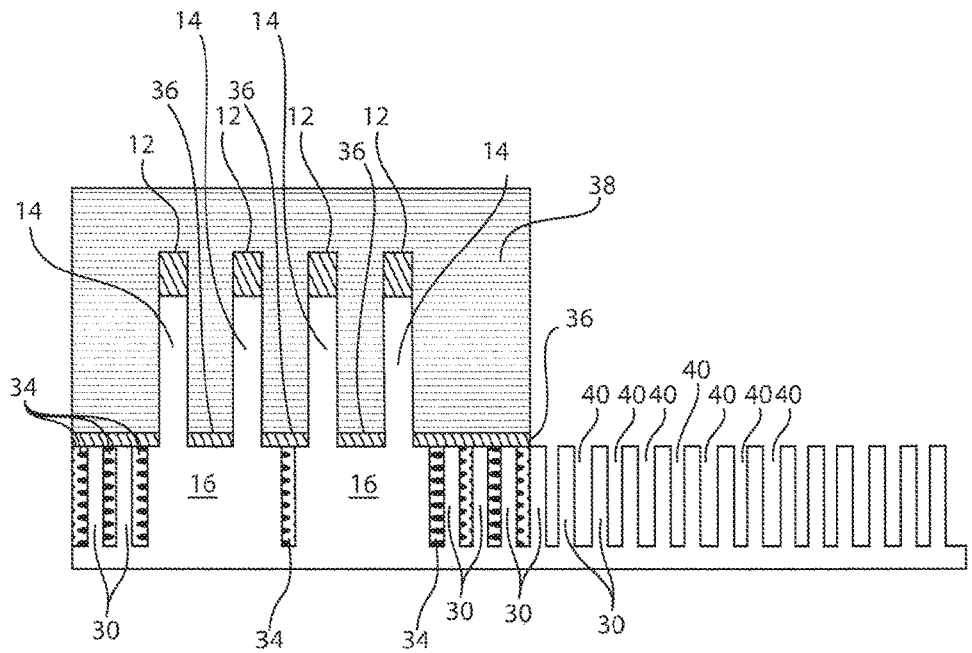
FIG. 13 is a cross-sectional view of the semiconductor device of FIG. 12 where a mask is applied, the bottom spacer is etched, and the oxide is removed between the pillars, in accordance with an embodiment of the present invention.

FIG. 13 is a cross-sectional view of the semiconductor device of FIG. 12 where a mask is applied, the bottom spacer is etched, and the oxide is removed between the pillars, in accordance with an embodiment of the present invention.

In various embodiments, a mask 38 is applied over the plurality of fins 14. The bottom spacer 36 is then etched and the oxide 34 in the troughs formed between the pillars 30 is removed. Thus, recesses or gaps or cavities 40 are formed between the pillars 30.

Figure 14:
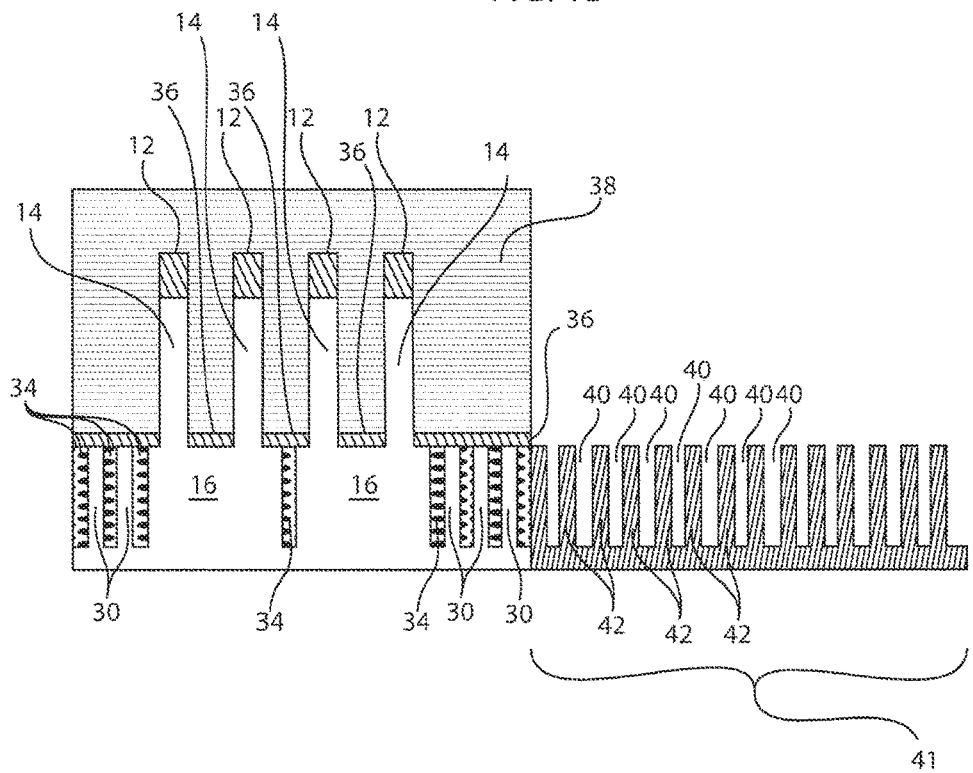
FIG. 14 is a cross-sectional view of the semiconductor device of FIG. 13 where the pillars are doped, in accordance with an embodiment of the present invention.

FIG. 14 is a cross-sectional view of the semiconductor device of FIG. 13 where the pillars are doped, in accordance with an embodiment of the present invention.

In various embodiments, the series of Si pillars 41 are doped to form doped pillars 42. The doped pillars 42 can be doped with n-type dopants or p-type dopants. "n-type" refers to the addition of impurities that contributes free electrons to an intrinsic semiconductor. In a silicon containing substrate examples of n-type dopants, i.e., impurities, include but are not limited to antimony, arsenic and phosphorous. "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

Figure 15:
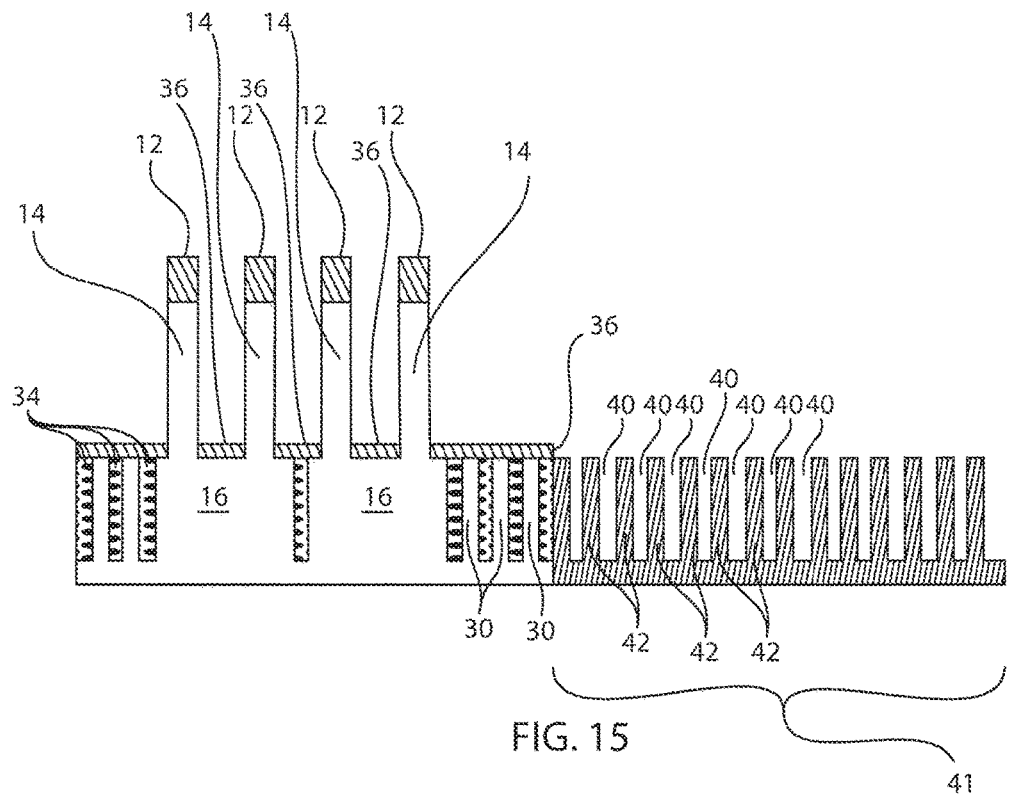
FIG. 15 is a cross-sectional view of the semiconductor device of FIG. 14 where the mask is stripped, in accordance with another embodiment of the present invention.

FIG. 15 is a cross-sectional view of the semiconductor device of FIG. 14 where the mask is stripped, in accordance with another embodiment of the present invention.

In various embodiments, the mask 38 is stripped to expose the plurality of fins 14. The region accommodating the plurality of fins 14 is separate and distinct from the region accommodating the doped pillars 42. Therefore, the structure can be split into two distinct regions. The left region which includes the plurality of fins 14 and the right region which includes the series of doped pillars 41.

Figure 16:
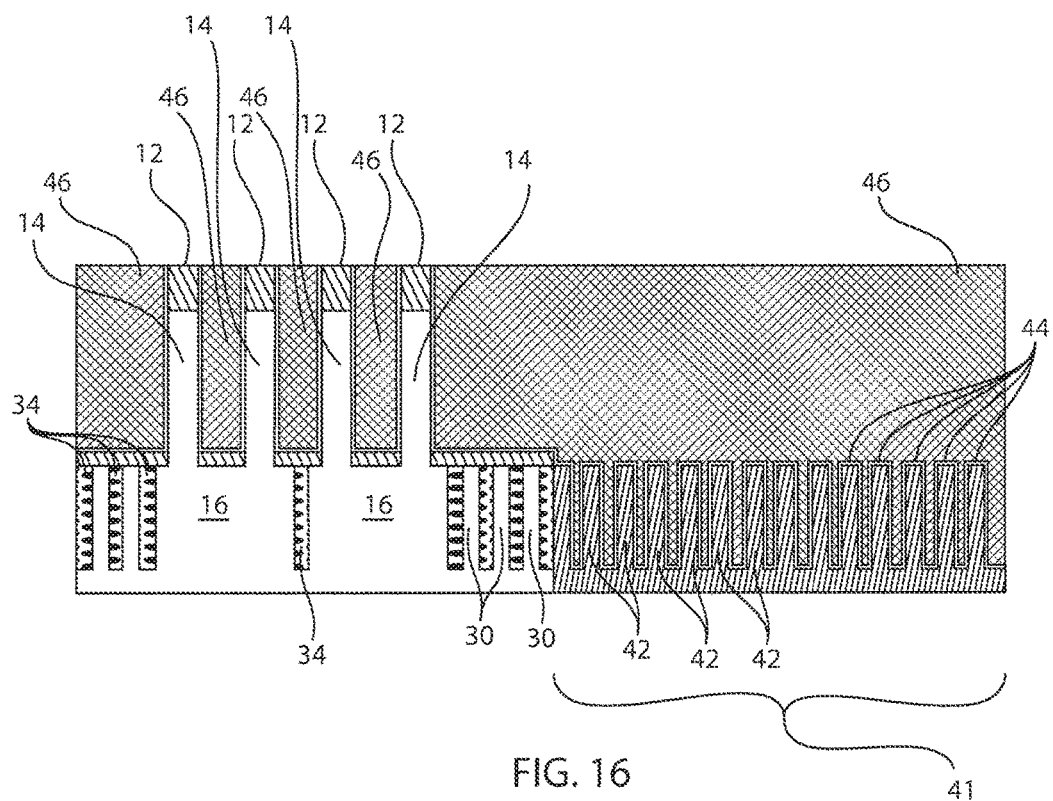
FIG. 16 is a cross-sectional view of the semiconductor device of FIG. 15 where high-k metal gate (HKMG) deposition is performed, in accordance with another embodiment of the present invention.

FIG. 16 is a cross-sectional view of the semiconductor device of FIG. 15 where high-k metal gate (HKMG) deposition is performed, in accordance with another embodiment of the present invention.

In various embodiments, a high-k metal gate (HKMG) 44, 46 is deposited. The high-k material 44 is first deposited an then the metal gate 46 is deposited.

The high-k material 44 can include but is not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3} Nb_{2/3} O_3$). The high-k material 44 can further include dopants such as lanthanum and/or aluminum. The stoichiometry of the high-K compounds can vary.

In various embodiments, the high-k material 44 can have a thickness in the range of about 1 nm to about 3 nm.

In various embodiments, the height of the metal gate 46 can be selectively reduced by chemical-mechanical polishing (CMP) and/or etching. Therefore, the planarization process can be provided by CMP. Other planarization process can include grinding and polishing. The height of the metal gate 46 can extend up to a proximal end of the plurality of fins 14 or up to the fin cap 12.

Figure 17:
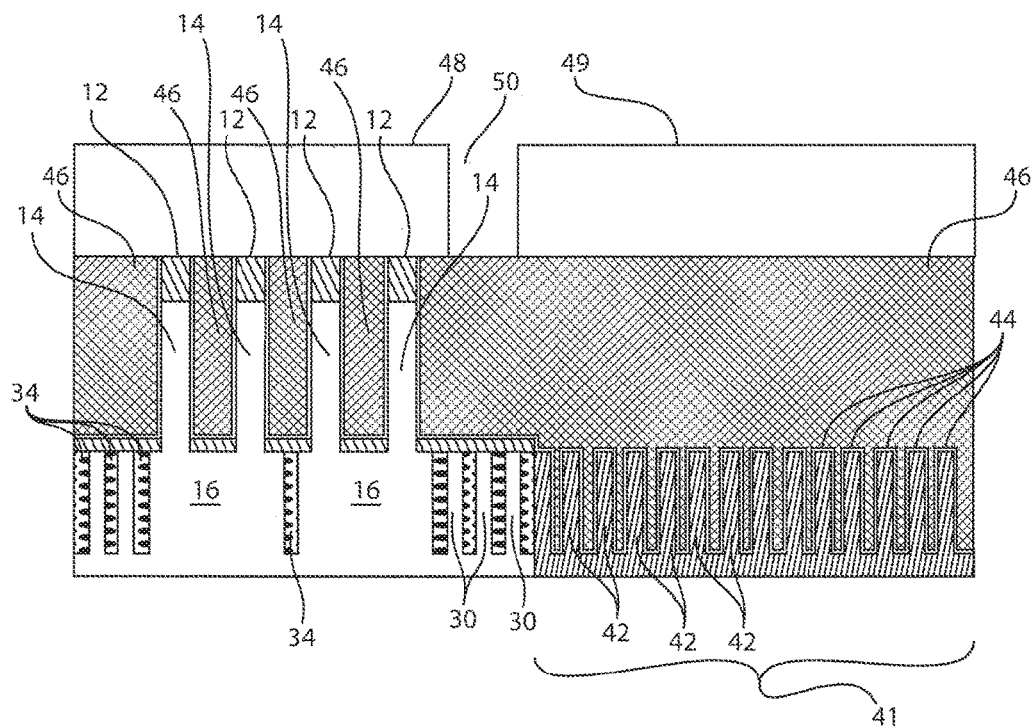
FIG. 17 is a cross-sectional view of the semiconductor device of FIG. 16 where gate mask patterning is performed, in accordance with another embodiment of the present invention.

FIG. 17 is a cross-sectional view of the semiconductor device of FIG. 16 where gate mask patterning is performed, in accordance with another embodiment of the present invention.

In various embodiments, gate mask patterns 48, 49 are applied over the HKMG 44, 46. The first gate pattern 48 can extend over the plurality of fins 14 or over a substantial portion of the first region accommodating the plurality of fins 14. The second gate pattern 49 can extend over the HKMG 44, 46 section formed over the series of doped pillars 41. The first and second gate patterns 48, 49 can be separate and distinct elements/components. The first and second gate patterns 48, 49 can be separated by a recess or gap 50.

Figure 18:
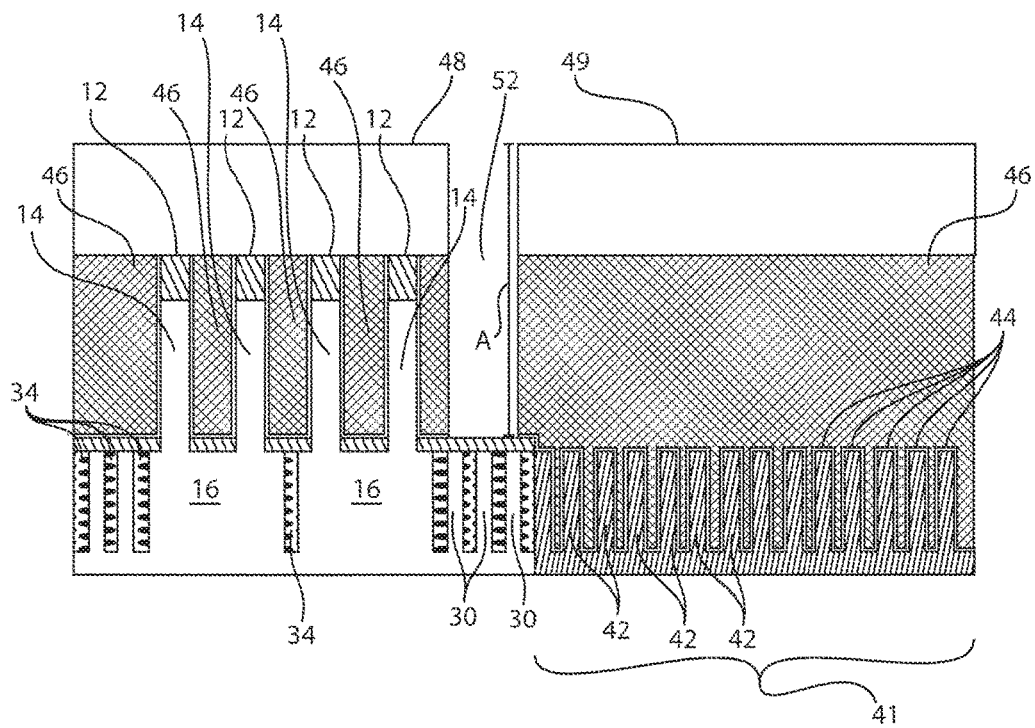
FIG. 18 is a cross-sectional view of the semiconductor device of FIG. 17 where a HKMG etch is performed, in accordance with an embodiment of the present invention.

FIG. 18 is a cross-sectional view of the semiconductor device of FIG. 17 where a HKMG etch is performed, in accordance with an embodiment of the present invention.

In various embodiments, a portion of the HKMG 44, 46 can be etched to extend the recess or gap 50 into gap region 52. The gap region 52 can extend a distance "A" up to the bottom spacer 36. Thus, the bottom spacer 36 between the first and second regions is exposed. The gap region 52 does not expose any of the doped pillars 42 and also does not expose any of the plurality of fins 14.

Figure 19:
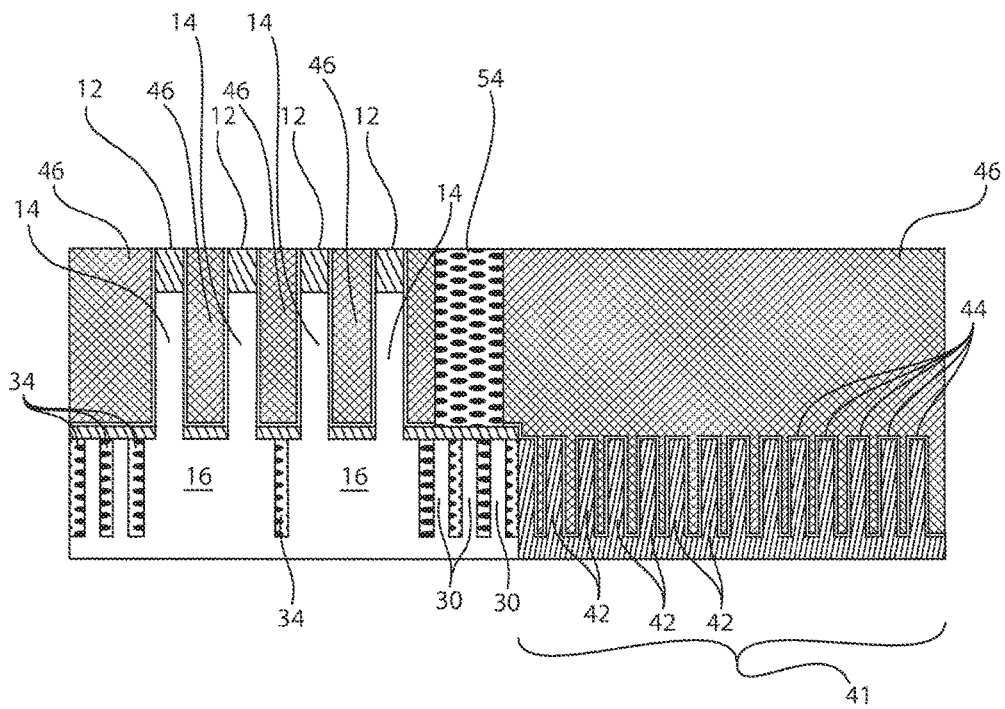
FIG. 19 is a cross-sectional view of the semiconductor device of FIG. 18 where the gate is removed and an oxide fill takes place, in accordance with an embodiment of the present invention.

FIG. 19 is a cross-sectional view of the semiconductor device of FIG. 18 where the gate is removed and an oxide fill takes place, in accordance with an embodiment of the present invention.

In various embodiments, the mask patterns 48, 49 are removed and the gap region 52 is filled with an oxide 54. The oxide 54 can be an ILD oxide, as described above. The oxide 54 extends up to a top surface of the bottom spacer 36.

In various embodiments, the height of the oxide 54 can be selectively reduced by chemical-mechanical polishing (CMP) and/or etching. Therefore, the planarization process can be provided by CMP. Other planarization process can include grinding and polishing.

Figure 20:
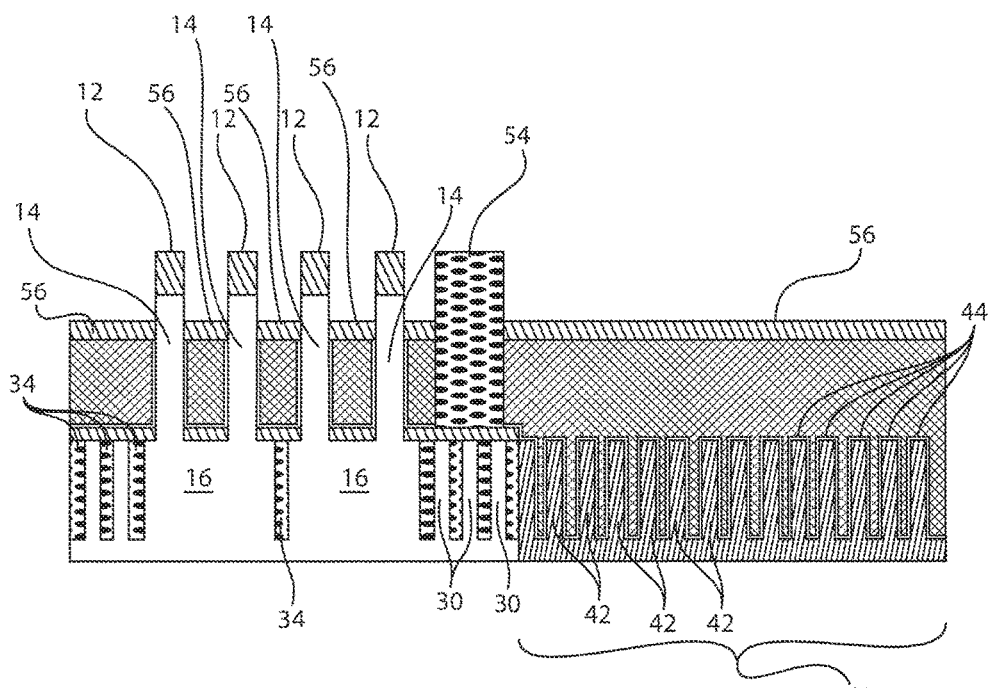
FIG. 20 is a cross-sectional view of the semiconductor device of FIG. 19 where the HKMG is recessed and a top spacer is deposited, in accordance with an embodiment of the present invention.

FIG. 20 is a cross-sectional view of the semiconductor device of FIG. 19 where the HKMG is recessed and a top spacer is deposited, in accordance with an embodiment of the present invention.

In various embodiments, the HKMG 44, 46 is recessed and a top spacer fill takes place. The top spacer is a second spacer 56, which is deposited, planarized, and etched back so that the top spacer 56 is filled between the fins 14 and deposited over the HKMG 44, 46 positioned over the doped pillars 42. The top spacer 56 can be, e.g., a nitride film.

In an embodiment, the top spacer 56 can be an oxide, for example, silicon oxide (SiO), a nitride, for example, a silicon nitride (SiN), or an oxynitride, for example, silicon oxynitride (SiON).

The planarization process can be provided by chemical mechanical planarization (CMP). Other planarization process can include grinding and polishing.

In one or more embodiments, the top spacer 56 can have a thickness in the range of about 3 nm to about 10 nm, or in the range of about 3 nm to about 5 nm.

Figure 21:
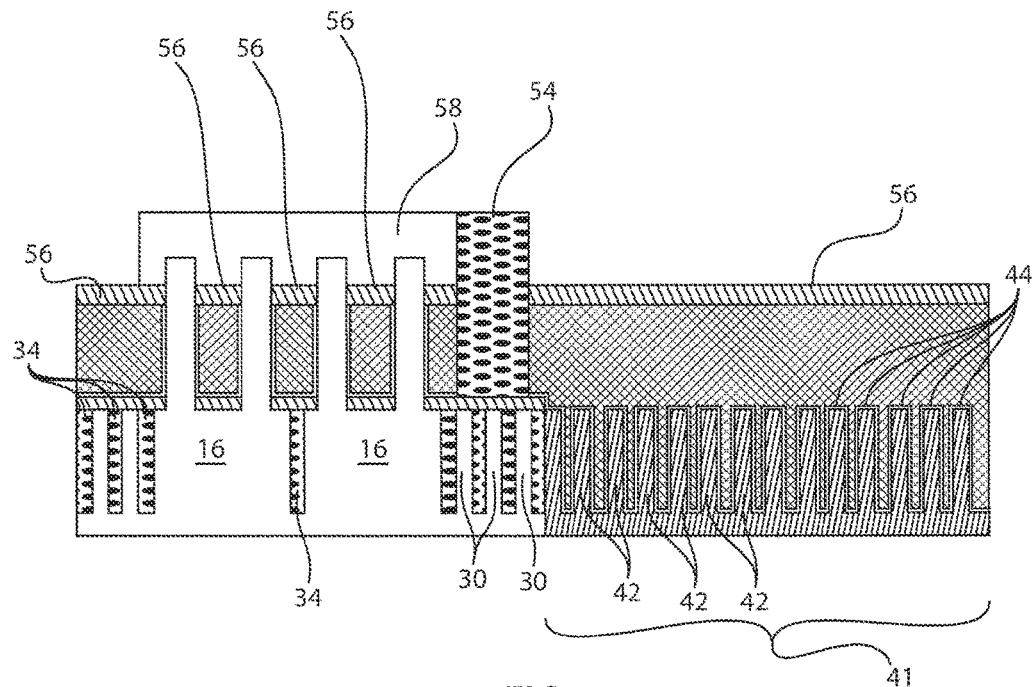
FIG. 21 is a cross-sectional view of the semiconductor device of FIG. 20 where epitaxial growth takes place over the fin region, in accordance with an embodiment of the present invention.

FIG. 21 is a cross-sectional view of the semiconductor device of FIG. 20 where epitaxial growth takes place over the fin region, in accordance with an embodiment of the present invention.

In various embodiments, an epitaxial growth layer or section 58 is formed over the plurality of fins 14.

The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. In some embodiments, the epitaxial deposition process is a selective deposition method, in which the epitaxial semiconductor material is formed only on semiconductor material deposition surfaces. The epitaxial deposition process will not form epitaxial semiconductor material on dielectric surfaces.

In some embodiments, the epitaxial semiconductor material can be composed of silicon (Si), germanium (Ge), silicon germanium (SiGe), silicon doped with carbon (Si:C) or a combination thereof. In one example, the p-type source and drain regions are provided by silicon germanium (SiGe) epitaxial semiconductor material. In one embodiment, a number of different sources can be used for the epitaxial deposition of the epitaxial semiconductor material.

Examples of silicon including source gasses can include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

Examples of germanium including source gasses for epitaxially forming the epitaxial semiconductor material of a germanium containing semiconductor include germane, digermane, halogermane, dichlorogermane, trichlorogermane, tetrachlorogermane and combinations thereof.

Epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from about 550° C. to about 900° C. Although higher temperature typically results in faster deposition, the faster deposition can result in crystal defects and film cracking.

The epitaxial semiconductor material can be in situ doped to a p-type conductivity or an n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material can introduce p-type dopants to the material being formed during the epitaxial deposition process that includes p-type source gasses.

Figure 22:
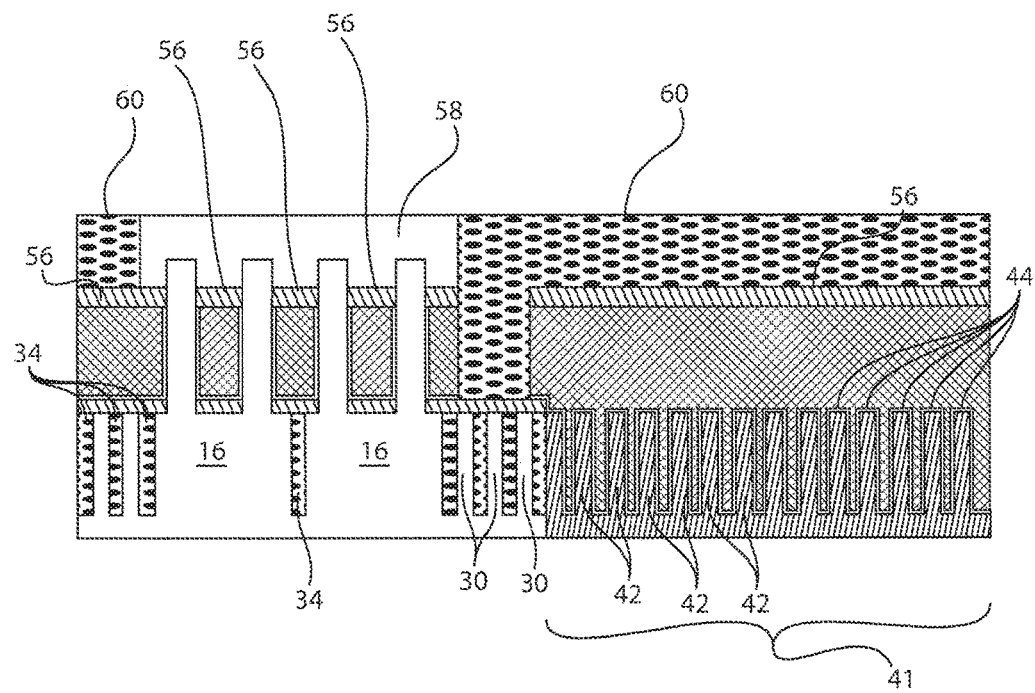
FIG. 22 is a cross-sectional view of the semiconductor device of FIG. 21 where oxide is applied over the top spacer of the HKMG, in accordance with an embodiment of the present invention.

FIG. 22 is a cross-sectional view of the semiconductor device of FIG. 21 where oxide is applied over the top spacer of the HKMG, in accordance with an embodiment of the present invention.

In various embodiments, another oxide fill takes place where oxide 60 is formed over the top spacer 56 positioned over the HKMG 44, 46 positioned over the doped pillars 42. This oxide 60 fills the second region of the structure. Additionally, some oxide 60 is also formed over a portion of the exposed top spacer 56 in the first region of the structure, adjacent the plurality of fins 14.

In various embodiments, the height of the oxide 60 can be selectively reduced by chemical-mechanical polishing (CMP) and/or etching. Therefore, the planarization process can be provided by CMP. Other planarization process can include grinding and polishing. The height of the oxide 60 can be approximately equal to the height of the epitaxial growth layer 58.

As a result, a MIS capacitor is formed via a VFET process. For example, the structure of FIG. 22 depicts a metal (i.e., gate material 46), an insulator (i.e., high-k dielectric 44), and a semiconductor (i.e., doped pillars 42) that together form a MIS capacitor on a region next to a region where a plurality of vertical fins are formed. Therefore, a single process can be used to form both a MIS capacitor and a VFET on a single substrate, such that the two structures (i.e., MIS capacitor and VFET) are separate and distinct elements or components or architectures on the substrate. The metes and bounds of the two structures can be clearly delineated or portrayed on the substrate.

Figure 23:
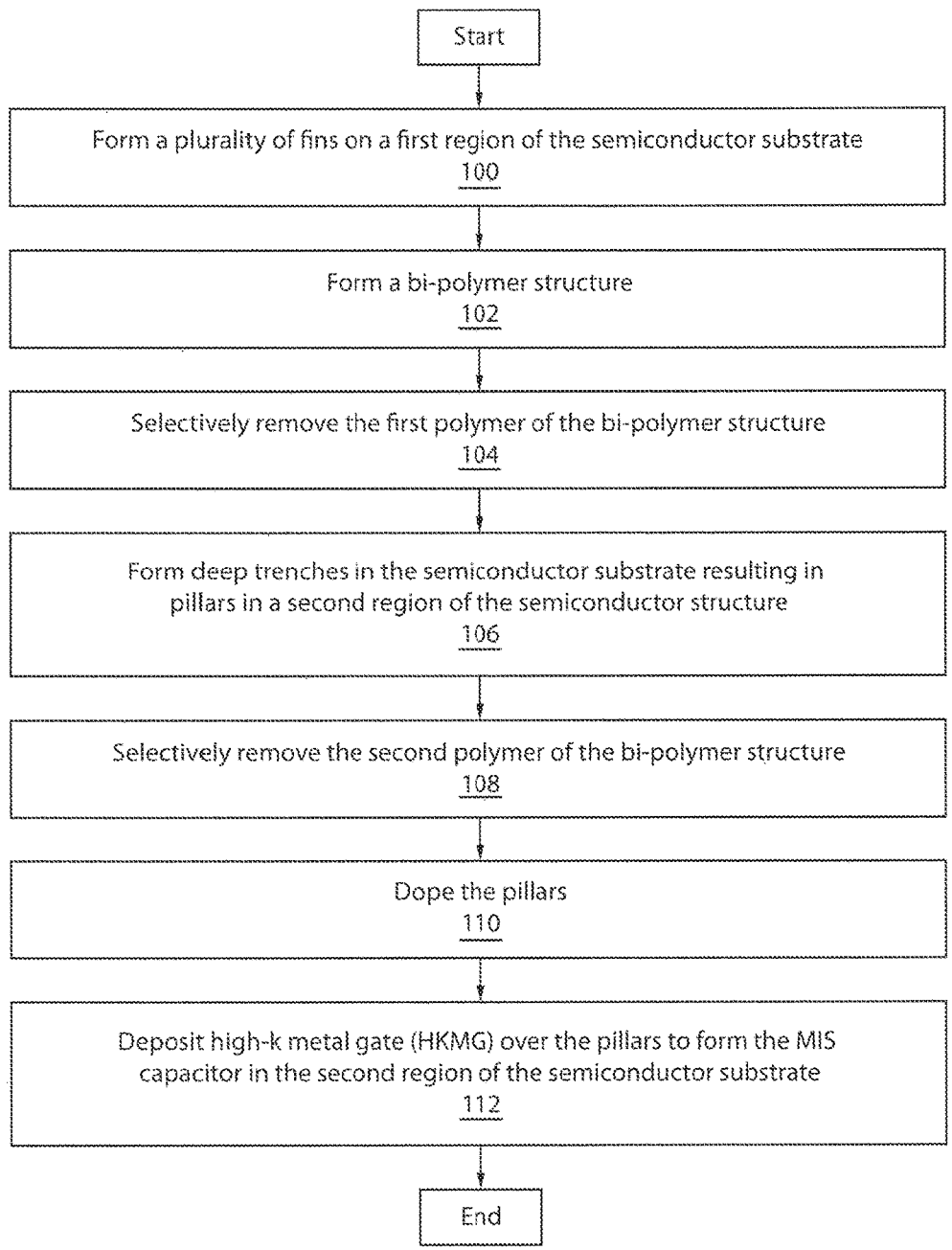
FIG. 23 is a block/flow diagram of an exemplary method for forming a semiconductor device having a MIS capacitor formed thereon, in accordance with an embodiment of the present invention.

FIG. 23 is a block/flow diagram of an exemplary method for forming a semiconductor device having a MIS capacitor formed thereon, in accordance with an embodiment of the present invention.

At block 100, a plurality of fins are formed on a first region of the semiconductor substrate.

At block 102, a bi-polymer structure is formed. The first and second polymers can be arranged in an alternating configuration.

At block 104, the first polymer of the bi-polymer structure is selectively removed.

At block 106, deep trenches are formed in the semiconductor substrate resulting in pillars in a second region of the semiconductor structure.

At block 108, the second polymer of the bi-polymer structure is selectively removed.

At block 110, the pillars are doped. The pillars can be n-doped or p-doped.

At block 112, a high-k metal gate (HKMG) is deposited over the pillars to form the MIS capacitor in the second region of the semiconductor substrate.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated for reducing parasitic back gate capacitance (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor structure for forming a metal-insulator-semiconductor (MIS) capacitor on a semiconductor substrate, the semiconductor structure comprising:
a plurality of fins formed over a first region of the semiconductor substrate;
a plurality of undoped pillars disposed in the first region of the semiconductor substrate extending within the semiconductor substrate, and being vertically misaligned with respect to the plurality of fins;
a plurality of doped pillars disposed in a second region of the semiconductor substrate; and
a high-k metal gate (HKMG) deposited over the first and second regions to form the MIS capacitor in the second region of the semiconductor substrate.

2. The structure of claim 1, wherein a bottom spacer is disposed over and in direct contact with the plurality of undoped pillars.

3. The structure of claim 1, wherein a top spacer is disposed in direct contact with an upper portion of the plurality of fins.

4. The structure of claim 1, wherein the plurality of doped pillars are encapsulated by the HKMG.

5. The structure of claim 1, wherein the plurality of fins are vertically misaligned with respect to the plurality of doped pillars.

6. The structure of claim 1, wherein the HKMG is deposited between the doped pillars.

7. The structure of claim 6, wherein the HKMG is deposited between the plurality of fins in the first region of the semiconductor substrate.

8. The structure of claim 7, wherein a first dielectric material separates the HKMG of the first and second regions of the semiconductor substrate.

9. The structure of claim 8, wherein a second dielectric material is deposited over the HKMG in the second region of the semiconductor substrate.

10. The structure of claim 9, wherein epitaxial growth is performed over exposed regions of the plurality of fins on the first region of the semiconductor substrate.

11. A semiconductor structure for forming a metal-insulator-semiconductor (MIS) capacitor on a semiconductor substrate, the semiconductor structure comprising:
a plurality of fins formed over a first region of the semiconductor substrate;
a plurality of undoped pillars disposed in the first region of the semiconductor substrate extending within the semiconductor substrate, and being vertically misaligned with respect to the plurality of fins;
a plurality of doped pillars disposed in a second region of the semiconductor substrate;
a bottom spacer formed at least over the undoped pillars in the first region; and
a high-k metal gate (HKMG) deposited over the second region to form the MIS capacitor in the second region of the semiconductor substrate.

12. The structure of claim 11, wherein the plurality of doped pillars are encapsulated by the HKMG.

13. The structure of claim 11, wherein the plurality of fins are vertically misaligned with respect to the plurality of doped pillars.

14. The structure of claim 11, wherein the plurality of undoped pillars have a same height as the plurality of doped pillars.

15. The structure of claim 11, wherein the HKMG is deposited between the plurality of doped pillars in the second region of the semiconductor substrate.

16. The structure of claim 11, wherein the HKMG is deposited between the plurality of fins in the first region of the semiconductor substrate.

17. The structure of claim 16, wherein a number of the plurality of doped pillars is greater than a number of the plurality of undoped pillars.

18. The structure of claim 17, wherein the HKMG is recessed to expose top portions of the plurality of fins and a top spacer is deposited.

19. The structure of claim 18, wherein epitaxial growth is performed over the exposed top portions of the plurality of fins.

20. The structure of claim 19, wherein an oxide is deposited over the top spacer in the second region and over the formed MIS capacitor.

* * * * *